(12) United States Patent
Enda

(10) Patent No.: US 8,008,778 B2
(45) Date of Patent: Aug. 30, 2011

(54) SEMICONDUCTOR DEVICE

(75) Inventor: Takayuki Enda, Fukushima-ken (JP)

(73) Assignee: Spansion, LLC, Sunnyvale, CA (US)

( * ) Notice: Subject to any disclaimer, the term of this patent is extended or adjusted under 35 U.S.C. 154(b) by 198 days.

(21) Appl. No.: 11/479,379

(22) Filed: Jun. 30, 2006

(65) Prior Publication Data
US 2007/0001311 A1    Jan. 4, 2007

Related U.S. Application Data

(63) Continuation-in-part of application No. PCT/JP2005/012059, filed on Jun. 30, 2005.

(51) Int. Cl.
*H01L 23/48* (2006.01)
(52) U.S. Cl. .......................... 257/763; 257/764
(58) Field of Classification Search .................. 438/618, 438/622, 625, 627, 628
See application file for complete search history.

(56) References Cited

U.S. PATENT DOCUMENTS

| | | | | |
|---|---|---|---|---|
| 4,924,295 A * | 5/1990 | Kuecher | ........................ | 257/758 |
| 5,380,678 A * | 1/1995 | Yu et al. | ........................ | 438/627 |
| 5,872,053 A * | 2/1999 | Smith | ........................ | 438/626 |
| 6,248,655 B1 * | 6/2001 | Machida et al. | ............... | 438/597 |
| 6,261,963 B1 * | 7/2001 | Zhao et al. | ..................... | 438/704 |
| 6,413,815 B1 * | 7/2002 | Lai et al. | ........................ | 438/243 |
| 6,444,565 B1 * | 9/2002 | Feild et al. | ..................... | 438/622 |
| 6,448,654 B1 * | 9/2002 | Gabriel et al. | ................. | 257/758 |
| 6,506,680 B1 * | 1/2003 | Kim et al. | ..................... | 438/692 |
| 6,787,458 B1 * | 9/2004 | Tripsas et al. | ................. | 438/652 |
| 6,841,472 B2 * | 1/2005 | Mayuzumi | ..................... | 438/640 |
| 2004/0043554 A1 * | 3/2004 | Wang et al. | ................... | 438/210 |
| 2005/0245071 A1 * | 11/2005 | Wu et al. | ....................... | 438/627 |

FOREIGN PATENT DOCUMENTS

| | | |
|---|---|---|
| JP | 2004014967 | 1/2004 |
| JP | 2004023030 | 1/2004 |
| JP | 2004119698 | 4/2004 |

\* cited by examiner

*Primary Examiner* — Wai Sing Louie
*Assistant Examiner* — Bilkis Jahan

(57) ABSTRACT

A semiconductor device includes a first metal layer provided above a semiconductor substrate, an interlayer insulating film provided above the first metal layer, a second metal layer that is provided in an opening formed in the interlayer insulating film and is in contact with an underlying layer, the second metal layer being connected to the first metal layer, and a first barrier layer that is provided between the second metal layer and the interlayer insulating film and has a different main composition from that of the underlying layer.

10 Claims, 15 Drawing Sheets

SEMICONDUCTOR DEVICE

CROSS-REFERENCE TO RELATED APPLICATIONS

This is a continuation in part of International Application No. PCT/JP2005/012059 filed Jun. 30, 2005, which was not published in English under PCT Article 21(2).

BACKGROUND OF THE INVENTION

1. Field of the Invention

The present invention relates to semiconductor devices and methods of fabricating the same, and more particularly, to a semiconductor device having a barrier metal between a metal layer and an interlayer insulating film and its fabrication method.

2. Description of the Related Art

The multilayer wiring technologies have been used in various semiconductor devices. The recent demands for miniaturization of semiconductor devices have resulted in various multilayer wiring technologies. An example of the wirings is a damascene technology disclosed in Carter W. Kaanta et al., DUAL DAMASCENE: A ULSI WIRING TECHNOLOGY, VMIC Conference, IEEE, pp. 144-pp. 152. This technology uses copper as a plug metal in a contact hole formed in an interconnection metal and an interlayer insulating film. A barrier metal is employed between the plug metal and the interlayer insulating film in order to prevent the plug metal from being diffused into the interlayer insulating film.

A conventional multilayer wiring process with copper will now be described with reference to FIGS. 1(a) through 1(d) and FIGS. 2(a) through 2(c), which are cross-sectional views showing the process. Referring to FIG. 1(a), a lower interconnection layer 16 is formed above a semiconductor substrate (not shown). The lower interconnection layer 16 extends laterally in FIG. 1(a), and has a major component of copper. An interlayer insulating film (not shown) that underlies the lower interconnection layer 16 appears in regions between the lower interconnection layers 16. A silicon nitride layer 20 is formed on the lower interconnection layer 16 and the underlying interlayer insulating film, and a silicon oxide film 22 serving as the interlayer insulating film is formed on the silicon nitride layer 20.

Referring to FIG. 1(b), contact holes are formed in the interlayer insulating film 22. Referring to FIG. 1(c), a barrier layer 24 is formed in the contact holes and the interlayer insulating film 22. Copper is deposited to form a seed layer (not shown) on the barrier layer 24 by sputtering. Copper is grown on the seed layer by plating. Referring to FIG. 1(d), the wafer is polished up to the interlayer insulating layer 22 by CMP so that the wafer surface is flattened. This results in plug metals 26 in the contact holes.

Referring to FIG. 2(a), a silicon nitride film 30 serving as an etching stopper is formed on the interlayer insulating film 22. Referring to FIG. 2(b), a silicon oxide film serving as an interlayer insulating film 32 is formed on the silicon nitride film 30. Referring to FIG. 2(c), openings are formed in the interlayer insulating film 32, and seed layers (not shown) and interconnection layers 34 having a major component of copper. Then, the wafer is polished up to the interlayer insulating film 32 by CMP. By the above process, one interconnection layer is completed. The process may be repeatedly carried out for multilayer wiring.

However, the above conventional art has the following problems. The same barrier layer as the barrier layer 24 between the plug metals 26 and the interlayer insulating film 22 is formed between the plug metals 26 and the interlayer insulating layer 16. This results in a large contact resistance between the plug metals 26 and the interlayer insulating film 16. Further, the barrier layer 34 exists between the interconnection layer 36 and the plug metals 26, and increases the contact resistance therebetween.

SUMMARY OF THE INVENTION

The present invention has been made in view of the above circumstances, and an object to provide a semiconductor device having a reduced contact resistance between metal layers laminated and its fabrication method.

According to an aspect of the present invention, there is provided a semiconductor device including: a first metal layer provided above a semiconductor substrate; an interlayer insulating film provided above the first metal layer; a second metal layer that is provided in an opening formed in the interlayer insulating film and is in contact with an underlying layer, the second metal layer being connected to the first metal layer; and a first barrier layer that is provided between the second metal layer and the interlayer insulating film and has a different main composition from that of the underlying layer. The first barrier layer is not provided between the second metal layer and the first metal layer. It is this possible to reduce the contact resistance between the second metal layer and the first metal layer. Further, the first barrier layer is formed without growing a layer in the opening in the interlayer insulating layer, and has improved coverage.

The semiconductor device of the invention may be configured so that the underlying layer is the first metal layer. The contact resistance between the second metal layer and the first metal layer can further be reduced.

The semiconductor device of the present invention may be configured so that the underlying layer is a second barrier layer. For example, the second barrier layer may have a composition having a lower resistivity than that of the first barrier. It is thus possible to reduce the contact resistance between the second metal layer and the first metal layer.

The semiconductor device of the invention may be configured so that the second metal layer has a different main composition from that of the first metal layer. Even when the second metal layer has the different main composition from hat of the first metal layer, the second barrier layer may have a composition and a film thickness separate from those of the first barrier layer.

The semiconductor device of the invention may be configured so that the first barrier layer has a width that decreases upwards. The coverage of the second metal layer in the opening can be improved.

The semiconductor device of the invention may be configured so that the second metal layer includes at least one of an interconnection layer and a plug metal. The present invention may be applied to a plug metal in a multilayer wiring structure or a barrier layer therein. The present invention may also be applied to a dual damascene structure capable of reducing the number of production steps.

According to another aspect of the present invention, there is provided a method of fabricating a semiconductor device including: forming a conductive film above a first metal layer formed above a semiconductor substrate, the conductive film serving as a first barrier layer; forming an opening in the conductive film by etching the conductive film; forming a second metal layer in the opening; and forming the first barrier layer by etching the conductive film except a region around the second metal layer. The first barrier layer is formed without growing a layer in the opening in the interlayer insulating layer, and has improved coverage for a side portion of the opening. There is no barrier layer between the second metal layer and the first metal layer, so that the contact resistance therebetween can be reduced.

The method of the invention may be configured so that forming the second metal layer includes forming a metal film above a whole surface of the semiconductor substrate in which the second metal film is formed from the metal film, and polishing the metal film up to the conductive film. In polishing the metal film, the conductive film is not likely to be polished as compared to the metal film, so that a problem of dishing hardly occurs. It is thus possible to flatten the surfaces of the second metal layer and the conductive film.

The method of the invention may be configured so that forming the second metal layer includes forming the second metal layer above the first metal layer. It is thus possible to further reduce the contact resistance between the second metal layer and the first metal layer.

The method of the invention may be configured so as to further include forming a second barrier layer above the first metal layer, wherein forming the conductive film includes forming the conductive film above the second barrier layer. For example, the second barrier layer may have a composition having a lower resistivity than that of the first barrier layer, so that the contact resistance between the second metal and the first metal can be reduced.

The method of the invention may be configured so that the composition of the second barrier layer is different from that of the first barrier layer. For example, the second barrier layer may have a composition having a lower resistivity than that of the first barrier layer, so that the contact resistance between the second metal and the first metal can be reduced.

The method of the invention may be configured so that the second metal layer has a different main composition from the first metal layer. Even when the second metal layer has the different main composition from hat of the first metal layer, the second barrier layer may have a composition and a film thickness separate from those of the first barrier layer.

The method of the invention may be configured so that forming the opening includes etching the conductive film so that the opening has a taper shape. It is thus possible to improve the coverage of the second metal in the opening.

The method of the invention may be configured so that forming the first barrier layer includes etching the whole surface of the conductive film. In forming the first barrier layer, the conductive film can be etched without photoresist, and the number of production steps can be reduced.

The method of the invention may be configured so as to further include forming an interlayer insulation film above the first metal layer between regions in which the second metal layer and the first barrier layer are formed. The interlayer insulating film may be formed after the barrier layer is formed. It is thus possible to improve the coverage of the barrier layer to a side portions of the opening.

The method of the invention may be configured so that forming the interlayer insulation film includes forming a layer that is to be the interlayer insulation film, said layer having a thickness greater than that of the second metal layer and the first barrier layer; and polishing said layer up to the second metal layer and the first barrier layer so as to be the interlayer insulation film. In polishing the metal film, the conductive film is not likely to be polished as compared to the metal film, so that a problem of dishing hardly occurs. It is thus possible to flatten the surfaces of the second metal layer and the conductive film.

The method of the invention may be configured so that forming the opening includes at least one of forming the opening in a region that is to be an interconnection layer in the conductive layer and forming a contact hole in the conductive layer; and forming the second metal layer includes at least of one of forming the interconnection layer in the region that is to be an interconnection layer and forming a plug metal in the contact hole. The present invention may be applied to a plug metal in a multilayer wiring structure or a barrier layer therein. The present invention may also be applied to a dual damascene structure capable of reducing the number of production steps.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be described, with reference to the accompanying drawings, of embodiments of the present invention.

First Embodiment

Figure 1A:
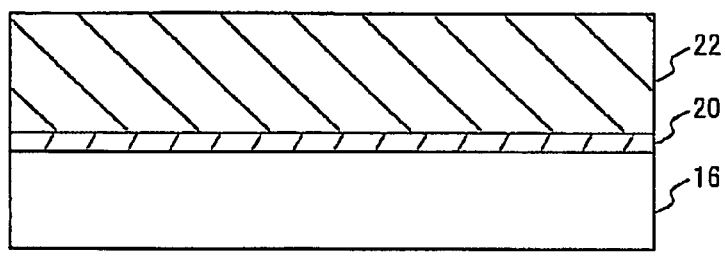
FIGS. 1(a) through 1(d) are cross-sectional views (first parts) showing a conventional process for fabricating a multilayer wiring.
Figure 1B:
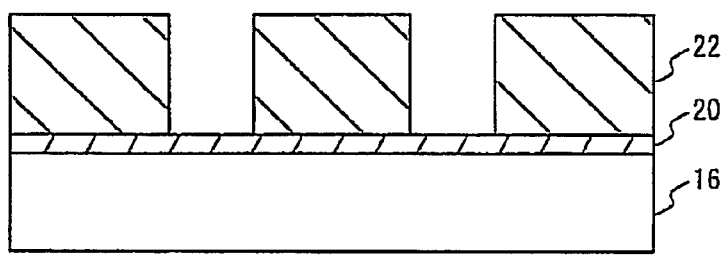
Figure 1C:
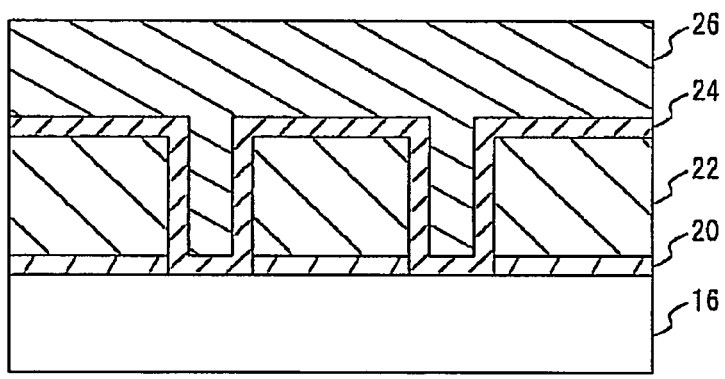
Figure 1D:
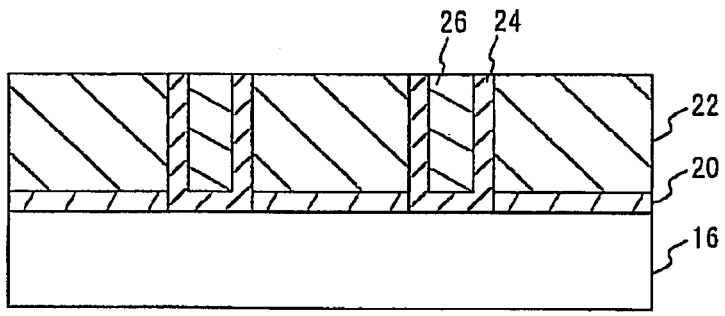
Figure 2A:
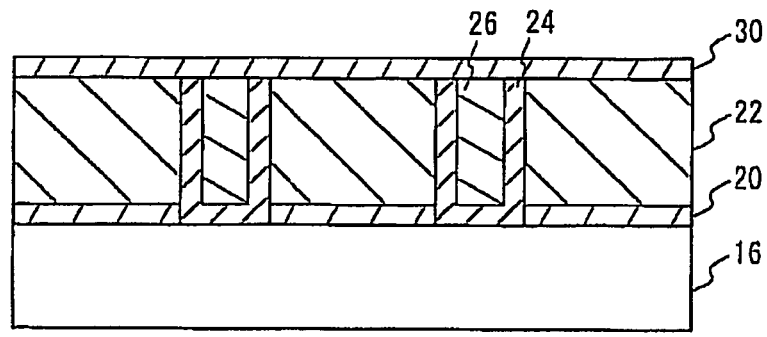
FIGS. 2(a) through 2(c) are cross-sectional views (second parts) showing the conventional process for fabricating the multilayer wiring.
Figure 2B:
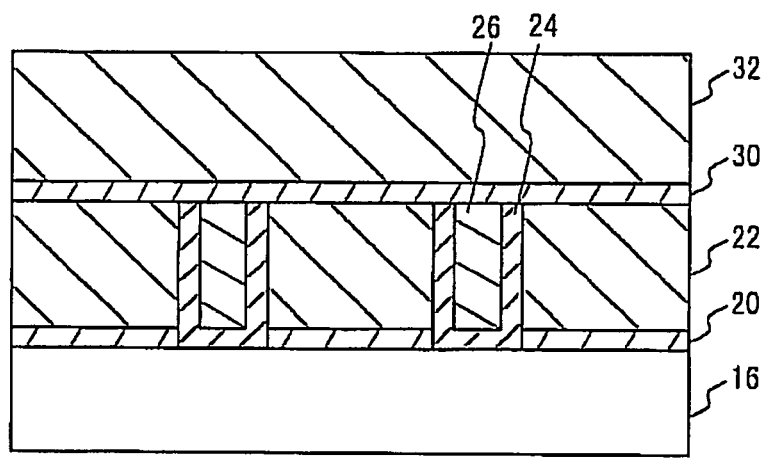
Figure 2C:
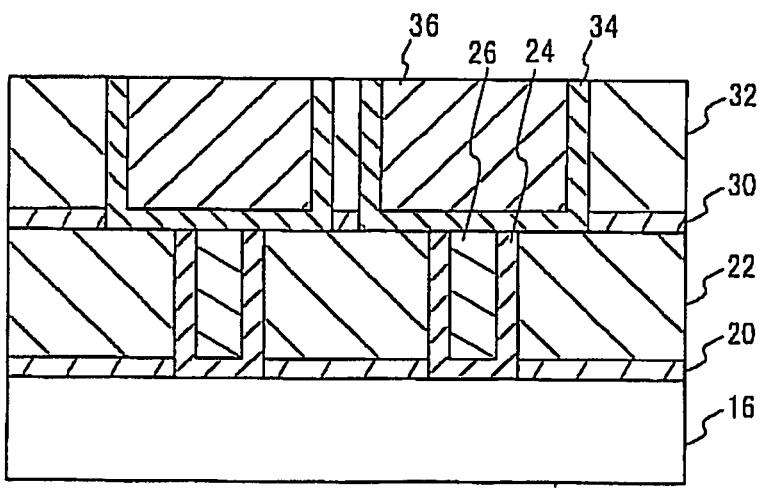
Figure 3A:
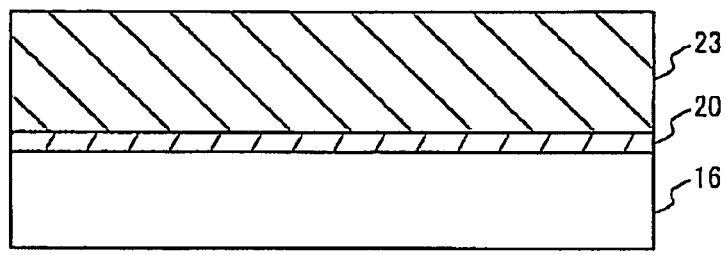
FIGS. 3(a) through 3(d) are cross-sectional views (first parts) showing a method of fabricating a multiplier wiring in accordance with a first embodiment.

FIGS. 3(a) through 3(d), FIGS. 4(a) through 4(d) and FIGS. 5(a) through 5(c) are cross-sectional views of a multi-layer wiring structure according to a first embodiment of the present invention. Referring to FIG. 3(a), the lower interconnection layer 16 is formed above a semiconductor substrate (not shown). The lower interconnection layer 16 is a lower metal layer that extends laterally in FIG. 3(a) and is mainly made of copper. An interlayer insulating film (not shown) that underlies the lower interconnection layers 16 appears in regions between the lower interconnection layers 16. The silicon nitride film 20 is formed on the lower interconnection layer 16 and the interlayer insulating film, and an electrically conductive film 23 from which the barrier layer 24 will be formed is formed on the silicon nitride film 20. The film 23 may be made of tantalum (Ta). The barrier layer 24 is required only to function as a barrier for plug metal and may be preferably made of Ti, TiN, TaN, W or WN other than tantalum (Ta). The barrier layer 24 may also be a film made of a material selected from a group composed of Ta, Nb, W, Mo, V, Cr, Zr, Ru, Ag, Au, Ti, Ni Pd, a nitride, an oxide or a boride. Preferably, the conductive film 23 may be slightly thicker than the final target thickness, and may be, for example, 200 nm to 400 nm.

Figure 3B:
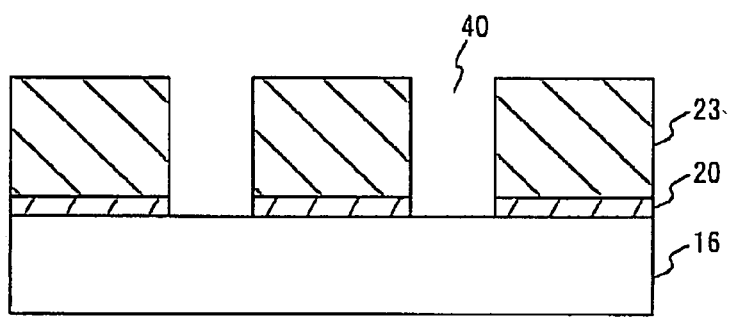
Figure 3C:
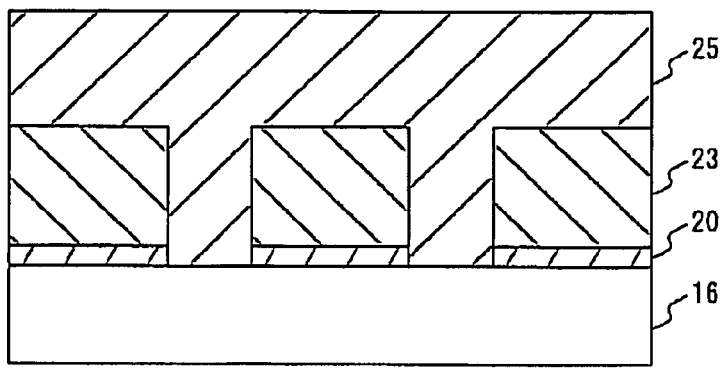
Figure 3D:
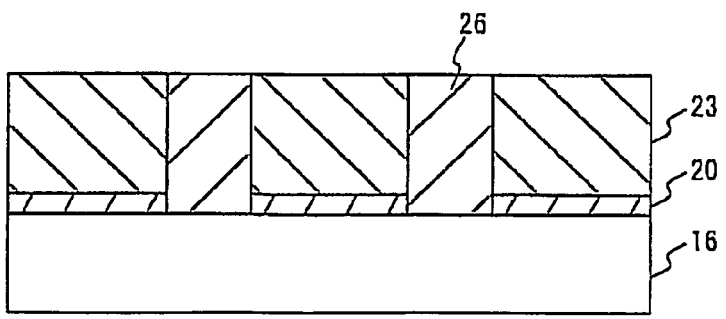

Referring to FIG. 3(b), the conductive film 23 is etched with a mask of photoresist (not shown) to form contact holes 40, which reach the lower interconnection layer 16 and may be approximately 100 to 200 nm in diameter. Etching of the conductive film 23 has selectivity to the silicon nitride film 20 and is stopped at the silicon nitride film 20. Then, the silicon nitride film 20 is etched. Etching of the conductive film 23 may use, for example, a chlorine-base gas. This etching results in the contact holes 40 having substantially vertical walls, and is surely stopped at the silicon nitride film 20. Referring to FIG. 3(c), a metal film 25 from which the plug metals 26 will be formed later, is formed on the entire surface of the semiconductor substrate by plating so as to be provided in the contact holes 40 and on the conductive film 23. The metal film 25 may have a major component of copper. Since the lower interconnection layer 16 is made of copper, there is no need to form a seed layer for plating of the metal film 25. However, a seed metal may be formed. In this case, the seed metal may be made of copper or the like and is formed by sputtering prior to plating of the metal layer 25. Referring to FIG. 3(d), the metal film 25 is polished up to the conductive film 23 by CMP. This results in plug metals 26.

Figure 4A:
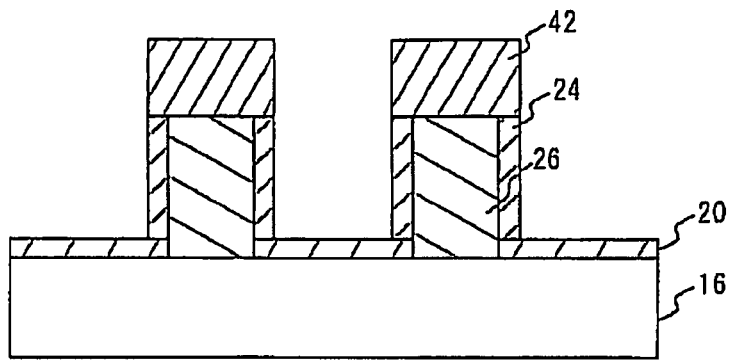
FIGS. 4(a) through 4(d) are cross-sectional views (second parts) showing the method of fabricating the multiplier wiring in accordance with the first embodiment.
Figure 4B:
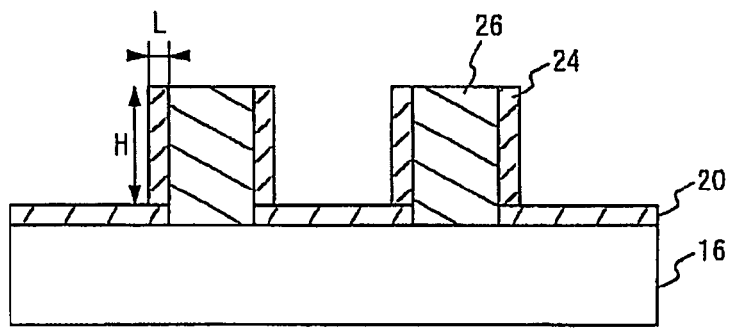

Referring to FIG. 4(a), a photoresist 42 having openings located in given positions is formed on the plug metals 26 and the conductive film 23. With the photoresist 42 being used as a mask, the conductive film 23 is etched except regions around the plug metals 26. This results in barrier layer 24 for each plug metal 26. The conductive film 23 may be etched in the same manner as shown in FIG. 3(b). Thus, the conductive film 23 can be etched substantially vertically and etching may be stopped at the silicon nitride film 20. Then, the photoresist 42 is removed. Preferably, the barrier layer 24 is 50-200 nm wide (L), and 200-400 nm high (H). The width L may be selected taking the barrier performance and the resistance of the contact holes into consideration. The minimum width of the interlayer insulating film 22 between the plug metals 26 may be 100 to 200 nm. It will be noted that the interlayer insulating film 22 between the plug metals 26 in FIGS. 3(a) through 5(c) are illustrated so as if it is wider than 200 nm in order to depict regions including interconnection layers 34.

Figure 4C:
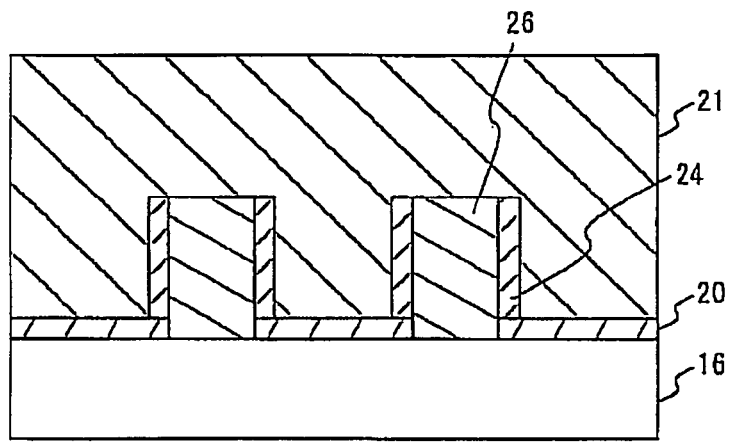
Figure 4D:
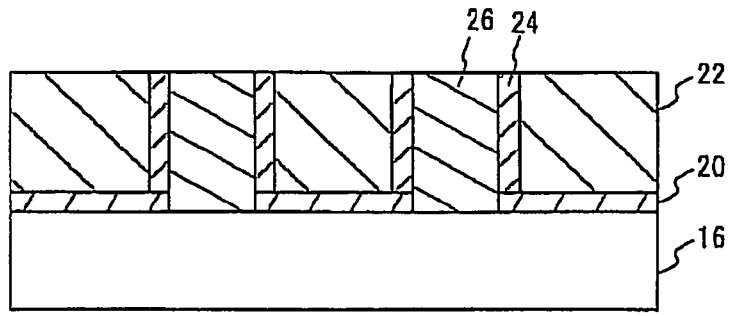
Figure 5A:
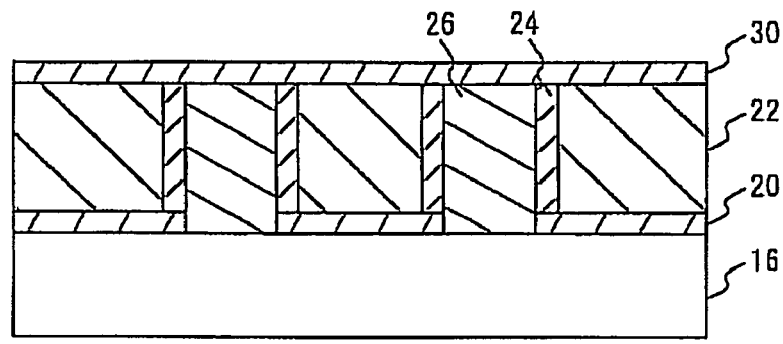
FIGS. 5(a) through 5(c) are cross-sectional views (third parts) showing the method of fabricating the multiplier wiring in accordance with the first embodiment.

Referring to FIG. 4(c), a silicon oxide film 21 serving as the interlayer insulating film 22 is provided on the interlayer interconnection layer 16 and the underlying interlayer insulating layer located between regions in which the plug metals 26 and the barrier layer 24 are formed so that the silicon oxide film 21 covers the plug metals 26 and the barrier layer 24. The silicon oxide film 21 may be formed by TEOS so that the surface of the silicon oxide film 21 between the regions having the plug metals 26 and the barrier layer 24 are higher than those of the plug metals 26 or barrier layer 24. Referring to FIG. 4(d), the silicon oxide film 21 is polished up to the plug metals 26 or the barrier layer 24 by CMP, so that the first interlayer insulating film 22 can be defined. Referring to FIG. 5(a), a silicon nitride film 30 is formed.

Figure 5B:
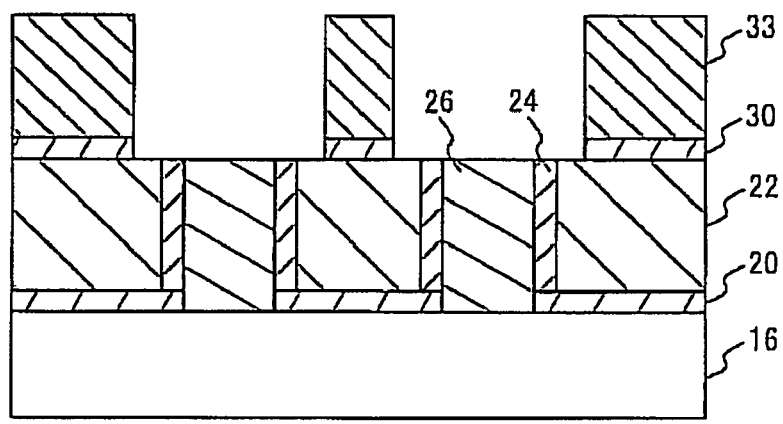
Figure 5C:
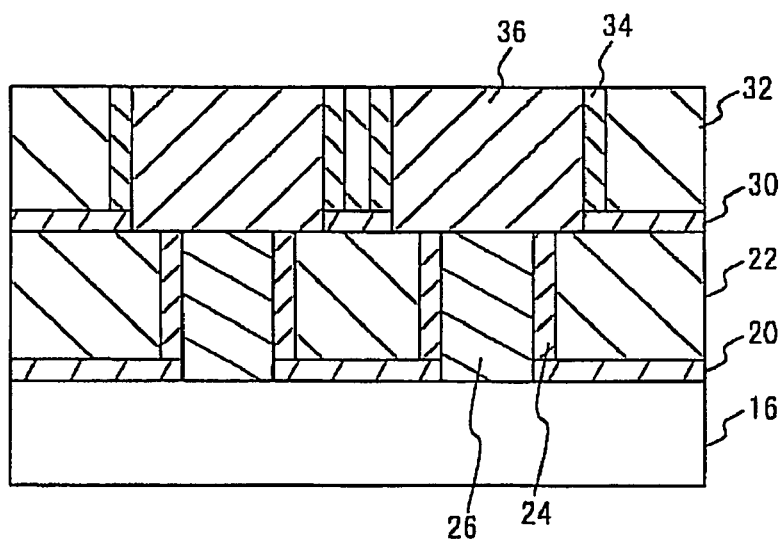

Referring to FIG. 5(b), an electrically conductive film 33 of tantalum (Ta) is formed on the interlayer insulating film 22, the plug metals 26 and the barrier layer 24. Any of the aforementioned materials used for the conductive film 23 may be used to form the conductive film 33. Regions in which interconnection layers 36 should be formed are etched in the same manner as shown in FIG. 3(b). After that, the silicon nitride film 30 is etched. Referring to FIG. 5(c), a barrier layer 34, interconnection layer 36 and interlayer insulating film 32, which respectively correspond to the barrier layer 34, the interconnection layer 36 and the interlayer insulating film 32 shown in FIGS. 3(c) through 4(d) are formed in the same manner as shown therein. Thus, there are provided the interconnection layer 36 mainly made of copper, the barrier layer 34 and the interlayer insulating film 32. Preferably, the interconnection layer 36 is approximately 250 nm high and fall within the rage of 200 to 400 nm. The minimum interconnection width and the minimum pitch may be approximately 250 nm and may be appropriately selected within the range of 100 nm to 1 μm. By the above-mentioned process, one layer of the multilayer wiring structure can be completed. The process may be repetitively carried out to form the multilayer wiring structure.

According to the first embodiment, there are provided the lower interconnection layer 16 (first metal layer) provided above the semiconductor substrate, the interlayer insulating film 22 provided on the lower interconnection layer 16 (first metal layer), and plug metals (second metal layers) that are in contact with the lower interconnection layer (underlying layer) 16 in contact holes (openings) 40 formed in the interlayer insulating film 22 and are connected to the lower interconnection layer 16 (first metal layer). The barrier layer 24 (first barrier layer) is not formed between the plug metals 26 (second metal layer) and the lower interconnection layer 16 (first metal layer), but is formed between the plug metals 26 (second metal layer) and the interlayer insulating film 22. Since the barrier layer 24 is not provided between the plug metals 26 and the lower interconnection layer 16, the contact resistance between the plug metals 26 and the lower interconnection layer 16 can be reduced.

There are also provided the plug metals (first metal layer) 26 provided above the semiconductor substrate, the interlayer insulating film provided on the plug metals, and the interconnection layer (second metal layer) 36 that is provided in contact with the plug metals (underlying layer) 26 in regions (openings) that should be an interconnection layer formed in the interlayer insulating film 32 and is connected to the plug metals (first metal layer) 26. The barrier layer (first barrier layer) 34 is not provided between the interconnection layer (second metal layer) 36 and the plug metals (first metal layer) 26, but is formed between the interconnection layer (second metal layer) 36 and the interlayer insulating film 32. Since the barrier layer 34 is not provided between the interconnection layer 36 and the plug metals 26, the contact resistance between the interconnection layer 36 and the plug metals 26 can be reduced.

In the first embodiment, the conductive film 23 except the regions around the plug (second metal layer) metals 26 are etched to form the barrier layer (first barrier layer) 24. It is thus possible to improve the coverage for the side portions of the contact holes as compared to that obtained by burying the barrier layer 24 in the contact holes by sputtering. Thus, even if the contact holes are miniaturized, the barrier layer 24 can be formed without degrading the coverage. The barrier layer 24 is not present between the plug metals 26 and the lower interconnection layer 26, and the contact resistance therebetween can be reduced.

As in the case of the first embodiment, the plug metals (second metal layer) 26 may contact the lower interconnection layer (first metal layer) 16. The underlying layer that the plug metals (second metal layer) 26 contact may be the lower interconnection layer (first metal layer) 16. It is thus possible to reduce the contact resistance between the plug metals 26 and the lower interconnection layer 16. When the plug metals 26 has the same major component as the lower interconnection layer 16, there is no need to provide the seed layer for plating and the number of fabrication steps can be reduced.

Further, as shown in FIG. 3(c), the metal film 25 is formed on the entire surface of the semiconductor substrate, and is polished up to the conductive film 23 by CMP. In this manner, the plug metals (second metal layer) 26 may be formed. When the metal film 25 is polished, the conductive film 23 is not likely to be polished as compared to the metal film 25 and problems of deshing or the like hardly occur. It is thus possible to flatten the plug metals 26 and the conductive film 23.

As shown in FIG. 4(c), the interlayer insulating film 22 can be formed on the lower interconnection layer (first metal layer) 16 and the underlying interlayer insulation film located between the regions in which the plug metals (second metal layer) 26 and the barrier layer (first barrier layer) 24 are formed. The interlayer insulating film 22 is formed after the barrier layer 24 is formed, so that the coverage of the barrier layer 24 for the side portions of the contact holes can be improved.

As shown in FIG. 4(c), the silicon oxide film 21 (which should be the interlayer insulating film) is formed so as to be thicker than the plug metals (second metal layer) 26 and the barrier layer (first barrier layer) 24, and is polished up to the plug metals (second metal layer) 24 or the barrier layer (first barrier layer) 24, as shown in FIG. 4(d). In this manner, the interlayer insulating film 22 can be formed. In polishing of the silicon oxide film 21, the plug metals 24 are not likely to be polished as compared to the metal film 25, and problems of deshing or the like hardly occur. It is thus possible to flatten the interlayer insulating film 22.

Second Embodiment

Figure 6A:
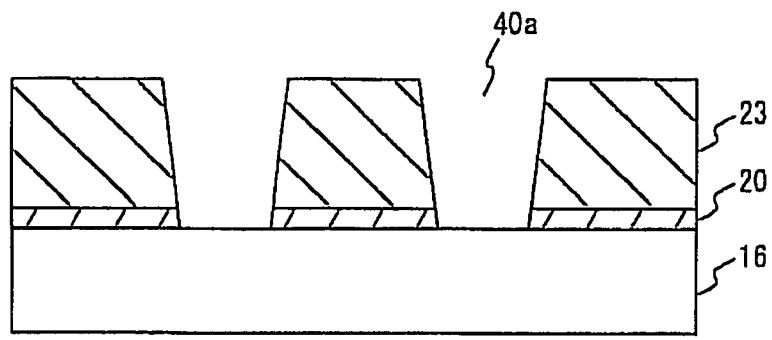
FIGS. 6(a) through 6(d) are cross-sectional views (first parts) showing a method of fabricating a multiplier wiring in accordance with a second embodiment.

A second embodiment has a barrier layer 24a substituted for the barrier layer 24 of the first embodiment. The barrier layer 24a has a width that becomes narrower upwards. FIGS. 6(a) through 6(d) and 7(a) through 7(c) are cross-sectional views showing a method of fabricating a multilayer wiring structure according to the second embodiment. Referring to FIG. 6(a), the lower interconnection layer 16, the silicon nitride film 20 and the conductive film 23 are formed above the semiconductor substrate (not shown) as shown in FIG. 3(a) of the first embodiment. With a photoresist (not shown) being used as a mask, the conductive film 23 is etched in a taper fashion to form contact holes 40a that reach the lower interconnection layer 16. The conductive film 23 may be etched by a chlorine-base gas, so that the contact holes 40a can be formed in a taper fashion. The contact holes 40a may have upper and lower diameters of 200 nm and 150 nm, respectively. Then, the silicon nitride film 20 is etched.

Figure 6B:
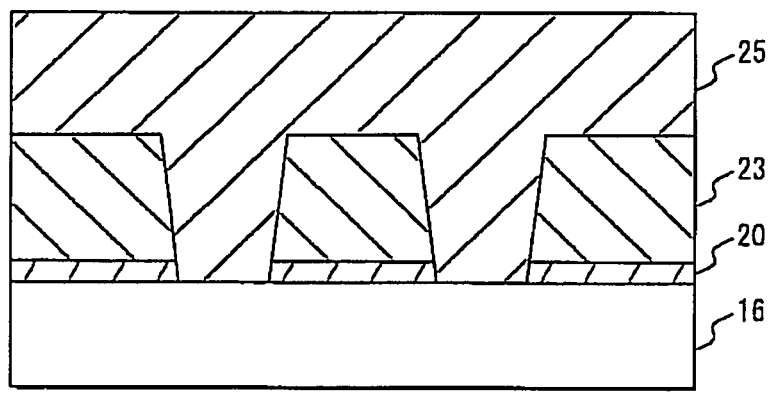
Figure 6C:
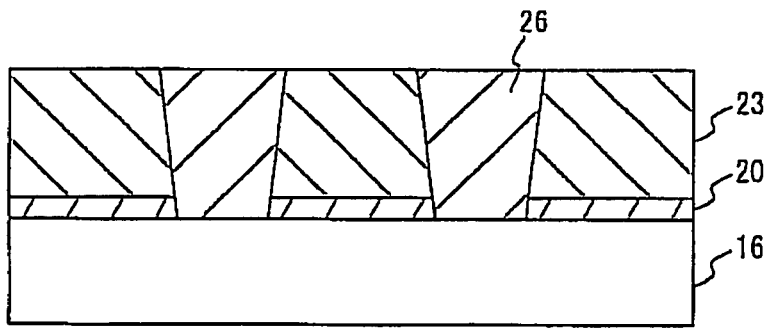

Referring to FIG. 6(b), the metal film 25 is formed by plating in the same manner as shown in FIG. 3(c). The metal film 25 may have a major component of copper. Referring to FIG. 6(c), the metal film 25 is polished up to the conductive film 23 by CMP, so that the plug metals 26 can be formed.

Figure 6D:
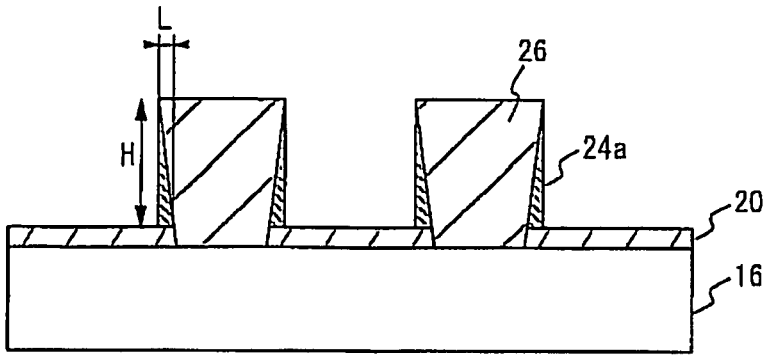

Referring to FIG. 6(d), the entire surface of the conductive film 23 is etched to form the barrier layers 24a. Since the interfaces between the plug metals 26 and the conductive film 23 are taper-shaped, the plug metals 24a remain. The conductive film 23 may be etched by, for example, a chlorine-base gas. Thus, the conductive film 23 is selectively etched with respect to the plug metals 26 and is substantially vertically etched. Preferably, the barrier layers 24a may be 200-400 nm high and 5-50 nm width in the lowermost.

Figure 7A:
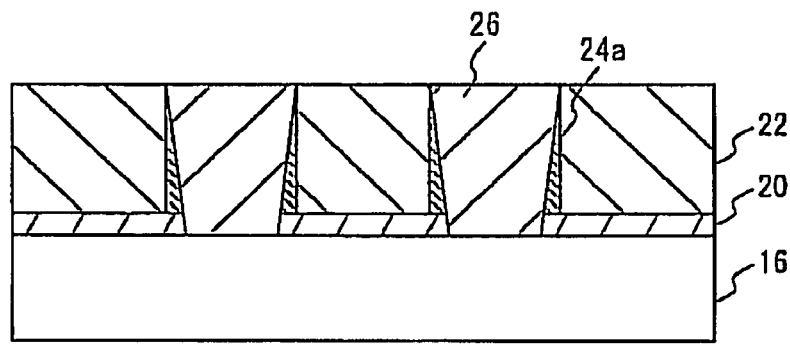
FIGS. 7(a) through 7(c) are cross-sectional views (second parts) showing the method of fabricating the multiplier wiring in accordance with the second embodiment.
Figure 7B:
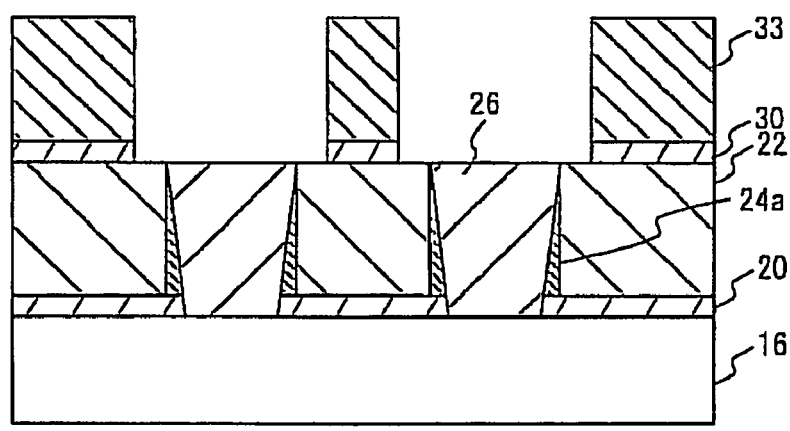
Figure 7C:
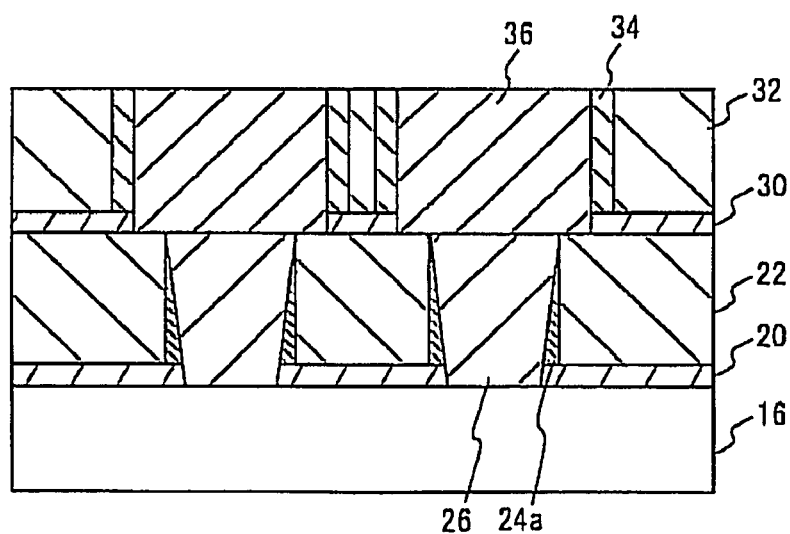

Referring to FIG. 7(a), the interlayer insulating film 22 is formed in the same manner as shown in FIGS. 4(c) and 4(d) of the first embodiment. Referring to FIG. 7(b), the silicon nitride film 30 and the conductive film 33 are formed in the same manner as shown in FIGS. 5(a) and 5(b). Referring to FIG. 7(c), the interconnection layer, the barrier layer 34 and the interlayer insulating film 32 are formed as shown in FIG. 5(c). In this manner, one layer of the multilayer wiring structure can be formed. The above process may be repeatedly carried out so that the multilayer wiring structure of the second embodiment can be obtained.

The second embodiment brings about the following effects in addition to those of the first embodiment. As shown in FIG. 6(a), the conductive film 23 is etched in a taper fashion to form the contact holes (openings) 40a. Thus, even when the contact holes are miniaturized, the coverage of the metal film 25 and that of the plug metals 26 in the contact holes 40a. In FIG. 6(d), the entire surface of the conductive film 23 is etched to form the barrier layers (first barrier layer) 40a. Thus, the barrier layers (first barrier layer) 24a become narrower upwards. The second embodiment does not need the photoresist 42 (FIG. 4(a) of the first embodiment) used for etching the conductive film 23 in the first embodiment. Thus, the number of fabrication steps can be reduced.

Third Embodiment

Figure 8A:
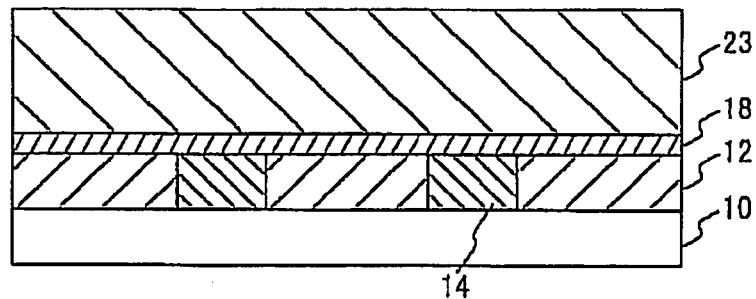
FIGS. 8(a) through 8(c) are cross-sectional views (first parts) showing the method of fabricating a multiplier wiring in accordance with a third embodiment.

A third embodiment has a lower interconnection layer 14 made of a different material from that of the plug metals 26. FIGS. 8(a) through 8(c) and FIGS. 9(a) through 9(c) are cross-sectional views showing a method of fabricating a multilayer wiring structure according to the third embodiment. Referring to FIG. 8(a), an active element such as a transistor (not shown) is formed on a silicon substrate 10. A silicon oxide film serving as the interlayer insulating film 12 is formed on the semiconductor substrate 10. The interlayer insulating film 12 is provided with the lower interconnection layer 14 that serve as an interconnection for making a connection with the active element and is made of tungsten. A titanium nitride layer serving as a second barrier layer 18 is formed on the interlayer insulating film 12 and the lower interconnection layer 14. The conductive film having a major component of tantrum is formed on the second barrier layer 18. Besides tantrum, the conductive layer 23 may be made of any of the materials usable in the first embodiment.

Figure 8B:
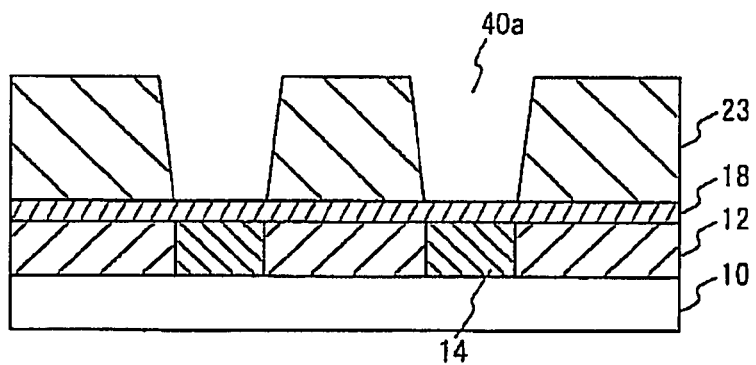
Figure 8C:
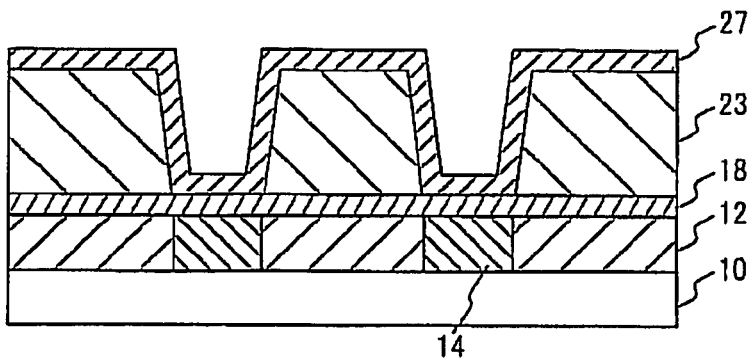
Figure 9A:
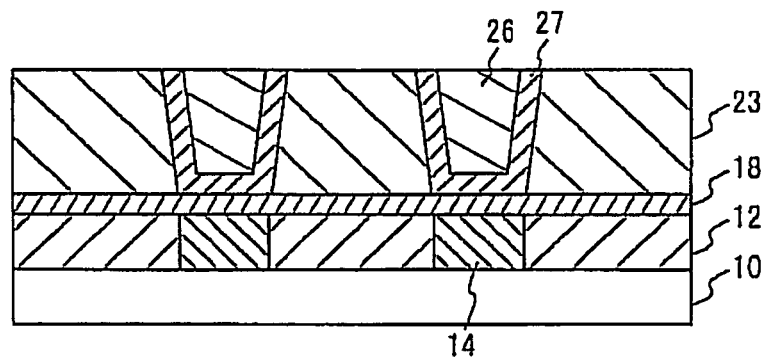
FIGS. 9(a) through 9(c) are cross-sectional views (second parts) showing the method of fabricating the multiplier wiring in accordance with the third embodiment.

Referring to FIG. 8(b), the contact holes 40a that reach the second barrier layer 18 are formed in the conductive film 23 in the same manner as shown in FIG. 6(a). The conductive film 23 may be etched by, for example, a chlorine-base gas, so that the contact holes 40a can be formed into a taper shape. The conductive film 23 can be selectively etched with respect to the second barrier layer 18. Referring to FIG. 8(c), a seed layer 27, which has a major component of copper, is formed in the contact holes 40a and on the conductive film 23 by sputtering. Referring to FIG. 9(a), a metal film is formed by plating in the same manner as shown in FIG. 3(c) of the first embodiment. The metal film is polished up to the conductive film 23 by CMP, so that the plug metals 26 can be formed.

Figure 9B:
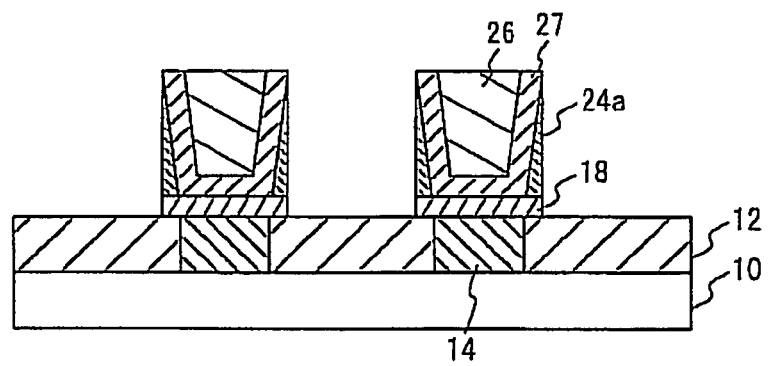
Figure 9C:
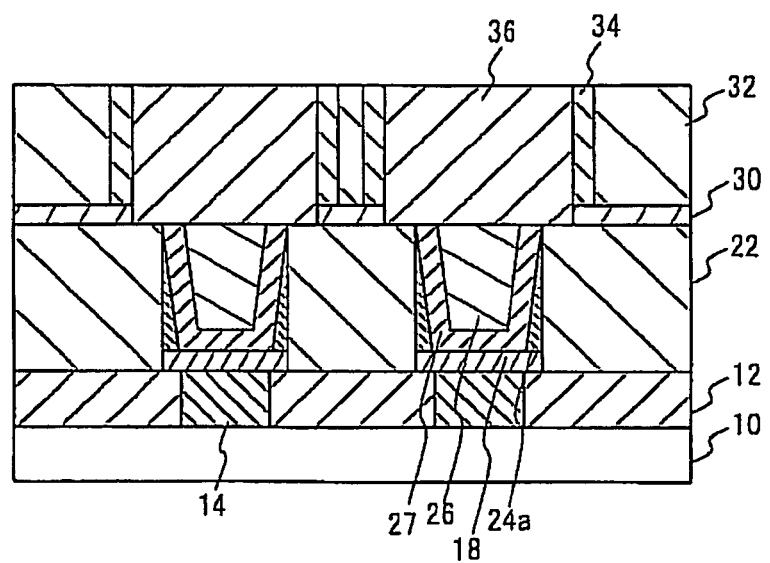

Referring to FIG. 9(b), the entire surface of the conductive film 23 is etched in the same manner as shown in FIG. 6(b) of the second embodiment, so that the barrier layers 24a can be formed. The conductive film 23 may be etched in the same manner as that of the second embodiment. After that, the second barrier layer 18 is etched. Referring to FIG. 9(c), the interlayer insulating film 32, the barrier layer 34 and the interconnection layer 36 are formed in the same manners as those shown in FIGS. 4(c) through 5(c) of the first embodiment. In this manner, one layer of the multilayer wiring structure can be completed. Upper layers may be formed in the same manner as those of the first or second embodiment so that the multilayer wiring structure of the third embodiment is completed.

The interconnection employed in the third embodiment has a structure in which the second barrier layer 18 is formed on the lower interconnection layer (first metal layer) 14, and the conductive film 23 is formed on the second barrier layer 18. Thus, the second barrier layer 18, which has a different composition from that of the first barrier layer 27, is provided between the lower interconnection layer (first metal layer) 14 and the plug metals (second metal layer) 26. That is, the underlying layer to which the plug metals (second metal layer) 26 is contacted is the second barrier layer 18. This allows the second barrier layer 18 to be formed of a material having a lower resistivity than that of the first barrier layer 27 and reduces the contact resistance between the lower interconnection layer 14 and the plug metals 26.

The lower interconnection layer is mainly made of tungsten and the plug metals 26 are mainly made of copper. The plug metals 26 have a different composition from that of the lower interconnection layer 14. In the first and second embodiments, the plug metals 26 and the lower interconnection layer 14 have an identical main component that may be copper. Thus, there is no need for a barrier layer between the interlayer insulating layer 14 and the plug metals 26. In contrast, preferably, the third embodiment employs the second barrier layer 18 for preventing metal of the plug metals (for example, copper) from being diffused into the lower interconnection layer 18.

In this case, a small amount of diffusion of copper into the lower interconnection layer 18 takes place, as compared to diffusion of copper into the interlayer insulating film 22. The second barrier 18 has a different composition from that of the first barrier layer 24. This reduces to the contact resistance between the lower interconnection layer 18 and the plug metals 26 although the barrier performance for diffusion of copper is not high. The second barrier layer 18 may have a thickness less than that of the first barrier layer 24a. This modification may bring about similar advantages. The second barrier layer 18 may be formed independently of the composition and film thickness of the first barrier layer 24a. The second barrier layer 18 may be made of any of the materials used to form the first barrier layer in the first embodiment.

Fourth Embodiment

Figure 10A:
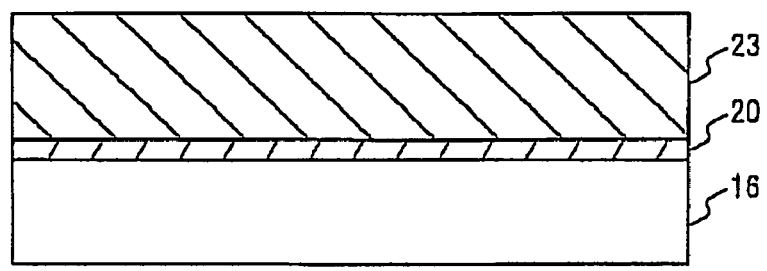
FIGS. 10(a) through 10(d) are cross-sectional views (first parts) showing the method of fabricating a multiplier wiring in accordance with a fourth embodiment.
Figure 10B:
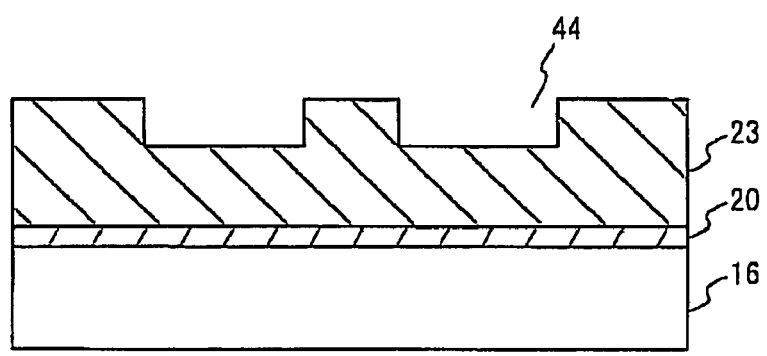
Figure 10C:
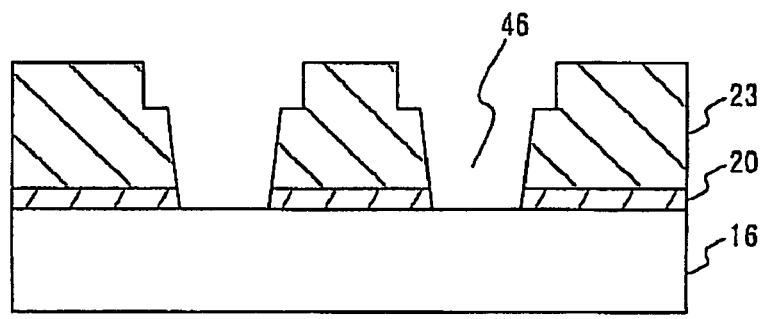

A fourth embodiment is an example of dual damascene in which a contact hole and an interconnection line are burned in a barrier layer. FIGS. 10(a) through 10(d) and FIGS. 11(a) through 11(c) are cross-sectional views showing a multilayer wiring structure according to a fourth embodiment of the present invention. Referring to FIG. 10(a), the lower interconnection layer 16, the silicon nitride film 20 and the conductive film 23 are formed above the semiconductor substrate (not shown) in the same manner as shown in FIG. 3(a) of the first embodiment. The conductive film 23 may be approximately 500 nm thick. Referring to FIG. 10(b), regions 44 in which an interconnection layer of the conductive film 23 should be formed are etched to a depth of approximately 250 nm. This etching may be carried out in the same manner as shown in FIG. 3(b). Referring to FIG. 10(c), contact holes 46 are formed in the conductive film 23. The contact holes 46 may be formed in the same manner as shown in FIG. 6(a). The process of FIG. 10(c) may be performed prior to that of FIG. 10(b).

Figure 10D:
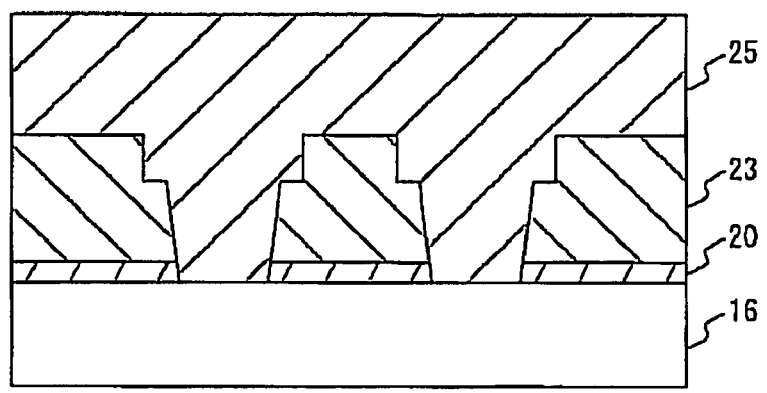
Figure 11A:
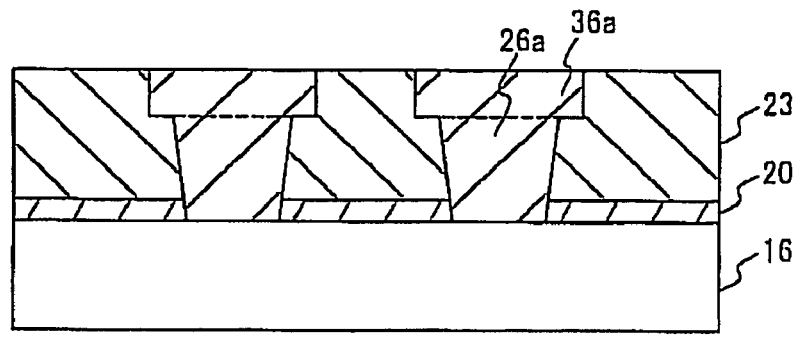
FIGS. 11(a) through 11(c) are cross-sectional views (second parts) showing the method of fabricating the multiplier wiring in accordance with the fourth embodiment.
Figure 11B:
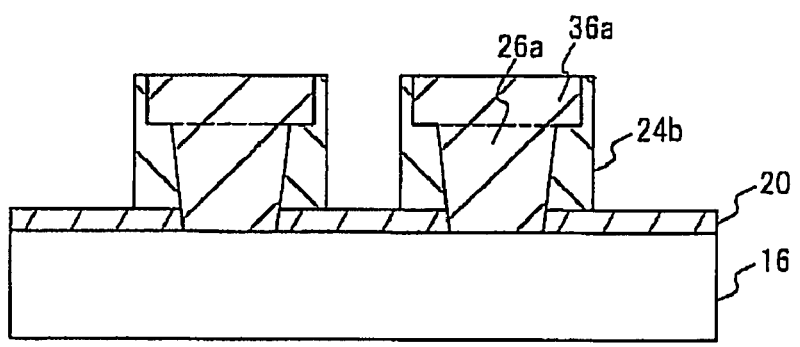

Referring to FIG. 10(d), the metal film 25 having a major component of copper is deposited on the entire surface by plating. Referring to FIG. 11(a), the metal film 25 is polished up to the conductive film 23 by CMP. This polishing results in plug metals 26a and an interconnection layer 36a. Referring to FIG. 11(b), a photoresist is formed in a given region and the conductive film is etched. This etching may be performed in the same manner as shown in FIG. 4(a) and results in a barrier layer 24b.

Figure 11C:
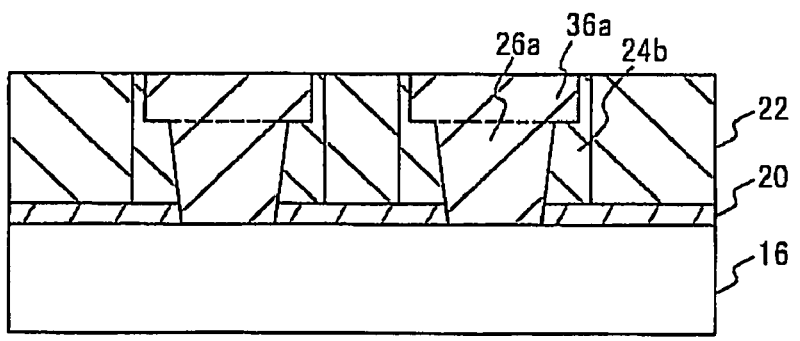

Referring to FIG. 11(c), a silicon oxide film is formed on the barrier layer 24b. As in the case of FIG. 4(d), the silicon oxide film is polished up to the barrier layer 24 by CMP. The resultant barrier layer (first barrier layer) 24b is provided between the plug metals 26a and the interlayer insulating film 22 and between the interconnection layer 36a and the interlayer insulating film 22 and is also provided between the interconnection layer 36a. The lines formed by the interconnection layer 36a extend in the direction vertical to the drawing sheet, and the barrier layer 24b is formed below the interconnection layer 36a. The plug metals 26a are formed in only regions connected to the lower interconnection layer 16. The above structure may be repeatedly provided so that the multilayer wiring structure of the fourth embodiment can be formed.

The fourth embodiment has the multilayer wiring structure applied to the dual damascene structure. Thus, the plug metal 26a and the interconnection layer 36a in each contact hole can be simultaneously formed, and the number of fabrication steps can be reduced. The fabrication methods of the first to fourth embodiments may be applied to not only the single-layer wiring structure but also the multilayer wiring structure.

The preferred embodiments of the present invention have been described. The present invention is not limited to the specifically described embodiments but include various variations and modifications within the range of the present invention as claimed. For example, the above-mentioned interconnection layers and plug metals are made of a metal that mainly contains copper. However, another metal may be used. The interlayer insulating films are not limited by the silicon oxide films but may be made of another material.

It should be appreciated that embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

Figure 12:
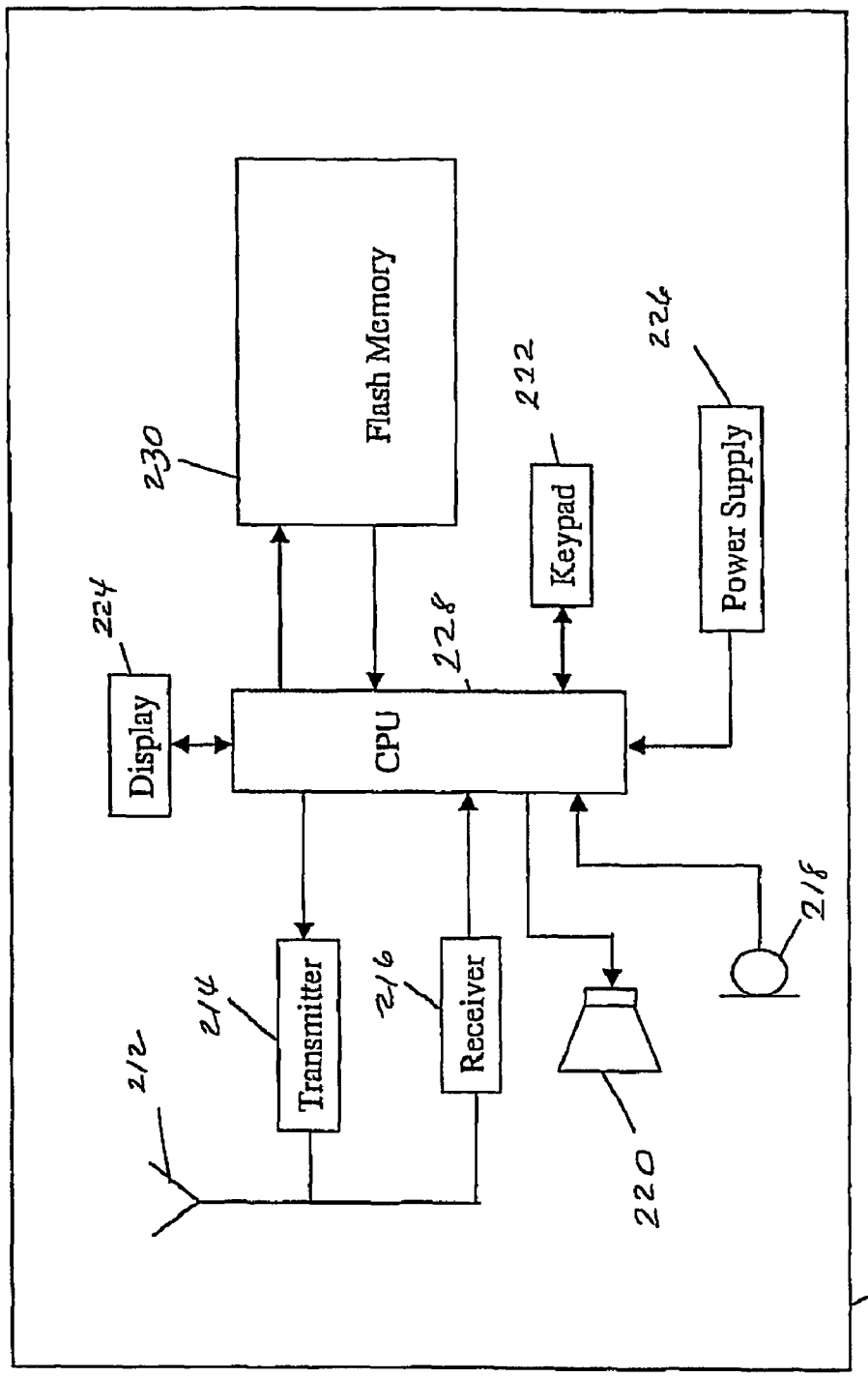
FIG. 12 shows a block diagram of a conventional portable telephone (a.k.a. cell phone, cellular phone, mobile phone, interne protocol phone, wireless phone, etc.), upon which embodiments can be implemented.

FIG. 12 shows a block diagram of a conventional portable telephone 210 (a.k.a. cell phone, cellular phone, mobile phone, interne protocol phone, wireless phone, etc.), upon which embodiments can be implemented. The cell phone 210 includes an antenna 212 coupled to a transmitter 214 a receiver 216, as well as, a microphone 218, speaker 220, keypad 222, and display 224. The cell phone 210 also includes a power supply 226 and a central processing unit (CPU) 228, which may be an embedded controller, conventional microprocessor, or the like. In addition, the cell phone 210 includes integrated, non-volatile memory 230.

In one embodiment, non-volatile memory 230 includes a flash memory that includes a first metal layer provided above a semiconductor substrate, an interlayer insulating film provided above the first metal layer, a second metal layer that is provided in an opening formed in the interlayer insulating film and is in contact with an underlying layer, the second metal layer being connected to the first metal layer, and a first barrier layer that is provided between the second metal layer and the interlayer insulating film and has a different main composition from that of the underlying layer.

Figure 13:
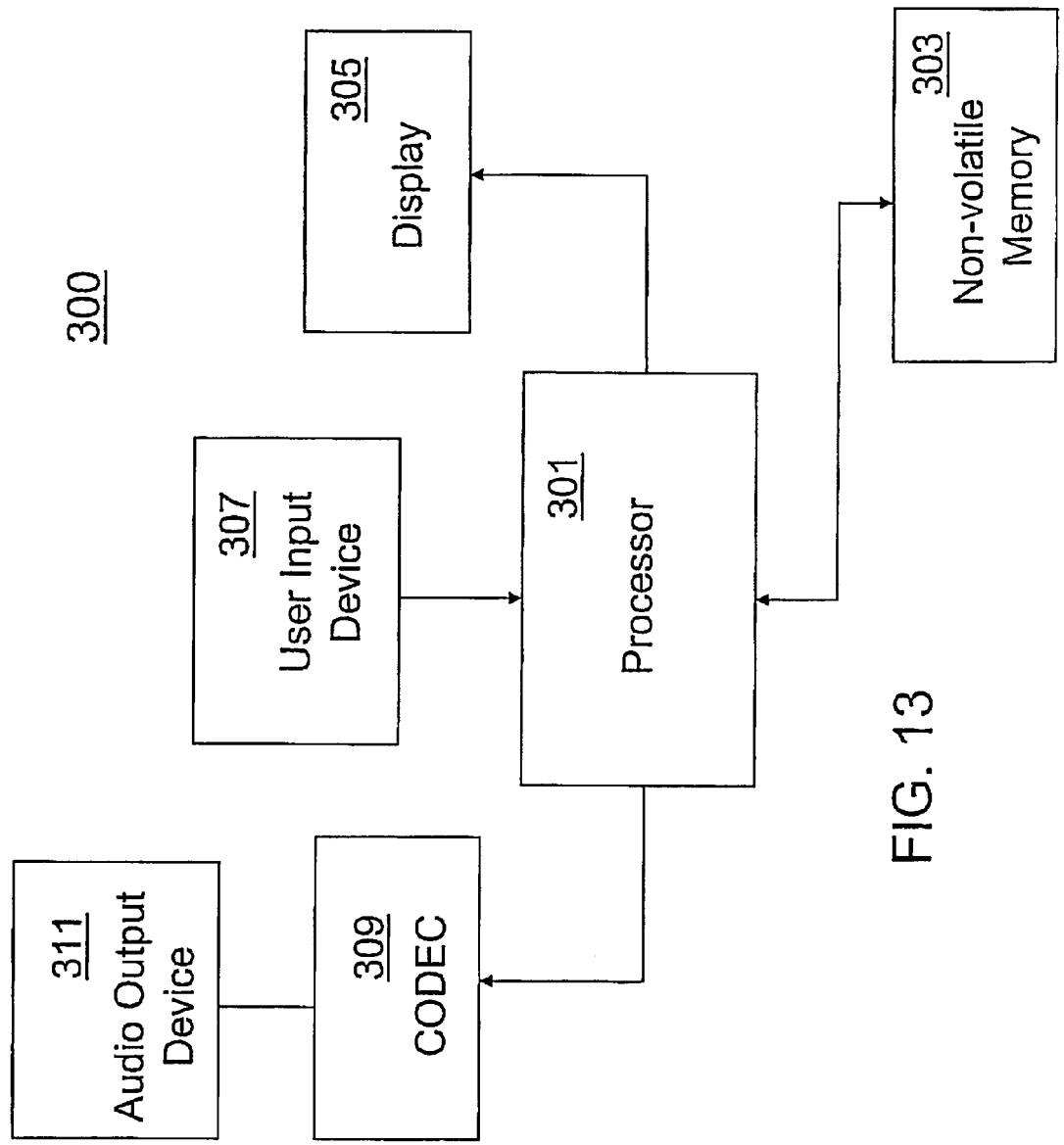
FIG. 13 shows a media player that uses a non-volatile memory device according to one embodiment of the present invention.

FIG. 13 shows a media player 300 that uses a non-volatile memory device according to one embodiment of the present invention. In the FIG. 13 embodiment, media player 300 includes processor 301, non-volatile memory 303, display 305, user input 307, codec 309 and audio output 311.

In operation, processor 301 executes playback of media files and controls the operation of media player 300. In one embodiment, user inputs made via user input 307 can be used to trigger file playback, file record, stop file playback, playback volume control, etc. Non-volatile memory 303 stores media files that may be stored for playback. In one embodiment, both audio and video files may be stored for playback. CODEC 309 produces an analog output signal that is supplied to audio output 411. In one embodiment, the playback of audio files can be facilitated via audio output 311 which can include but is not limited to speakers and headphones. In one embodiment, the playback of video files can be facilitated by a display 305 screen.

In one embodiment, non-volatile memory 303 includes a flash memory that includes a first metal layer provided above a semiconductor substrate, an interlayer insulating film provided above the first metal layer, a second metal layer that is provided in an opening formed in the interlayer insulating film and is in contact with an underlying layer, the second metal layer being connected to the first metal layer, and a first barrier layer that is provided between the second metal layer and the interlayer insulating film and has a different main composition from that of the underlying layer.

Figure 14:
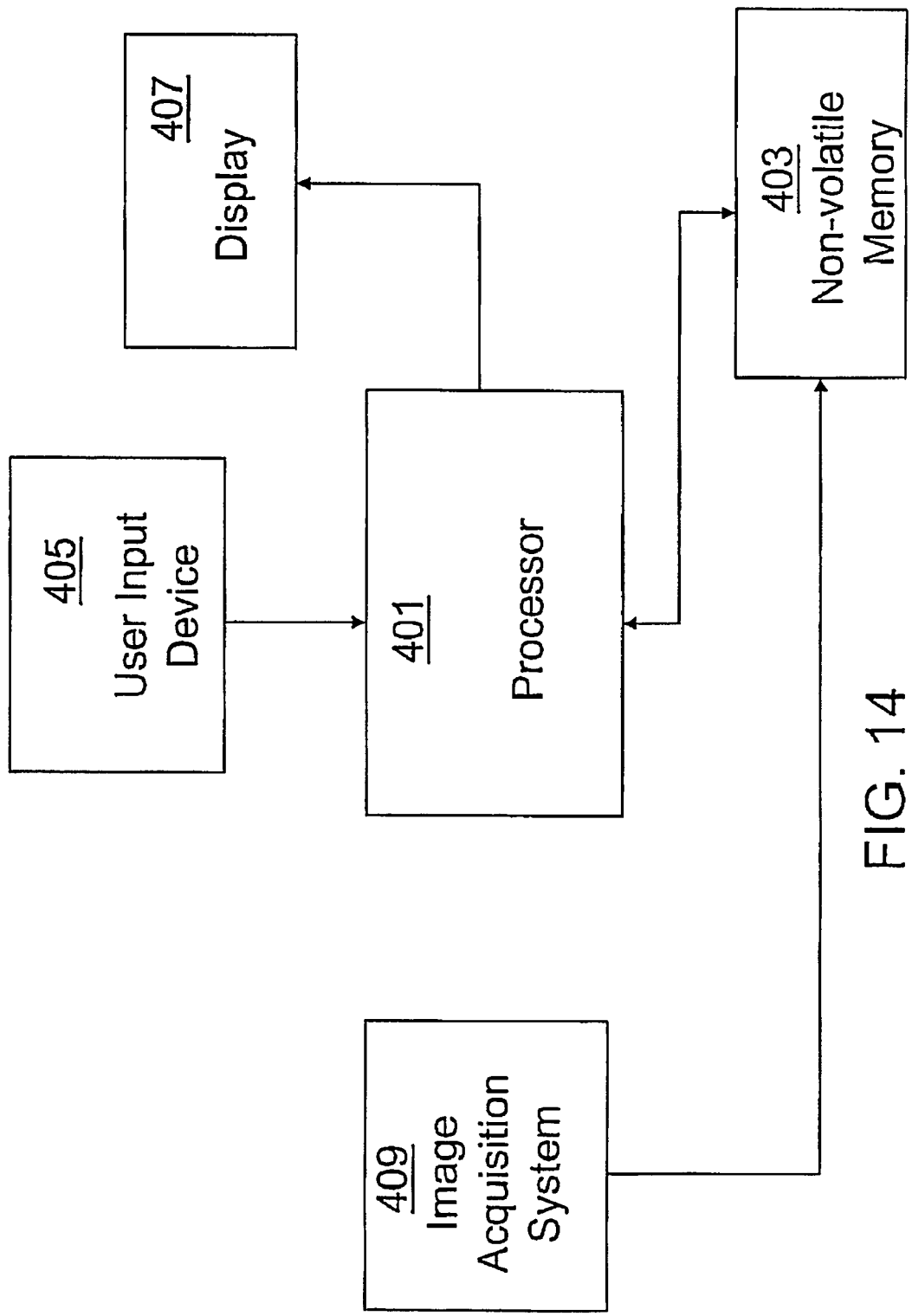
FIG. 14 shows a camera that uses a non-volatile memory device as is described in detail herein according to one embodiment of the present invention.

FIG. 14 shows a camera 400 that uses a non-volatile memory device as is described in detail herein according to one embodiment of the present invention. In the FIG. 14 embodiment, camera 400 includes processor 401, non-volatile memory 403, user input 405, display screen 407 and image acquisition system 409.

In operation, processor 401 controls the operation of camera 400 including the processing of image data acquired by image acquisition system 409. In one embodiment, user inputs made via user input 405 can be used to trigger image acquisition, storage, processing, display, etc. Non-volatile memory 403 stores image files that may be stored for uploading or display purposes. In one embodiment, images may be presented on display screen 407.

In one embodiment, non-volatile memory 403 can include a flash memory that includes a first metal layer provided above a semiconductor substrate, an interlayer insulating film provided above the first metal layer, a second metal layer that is provided in an opening formed in the interlayer insulating film and is in contact with an underlying layer, the second metal layer being connected to the first metal layer, and a first barrier layer that is provided between the second metal layer and the interlayer insulating film and has a different main composition from that of the underlying layer.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 15:
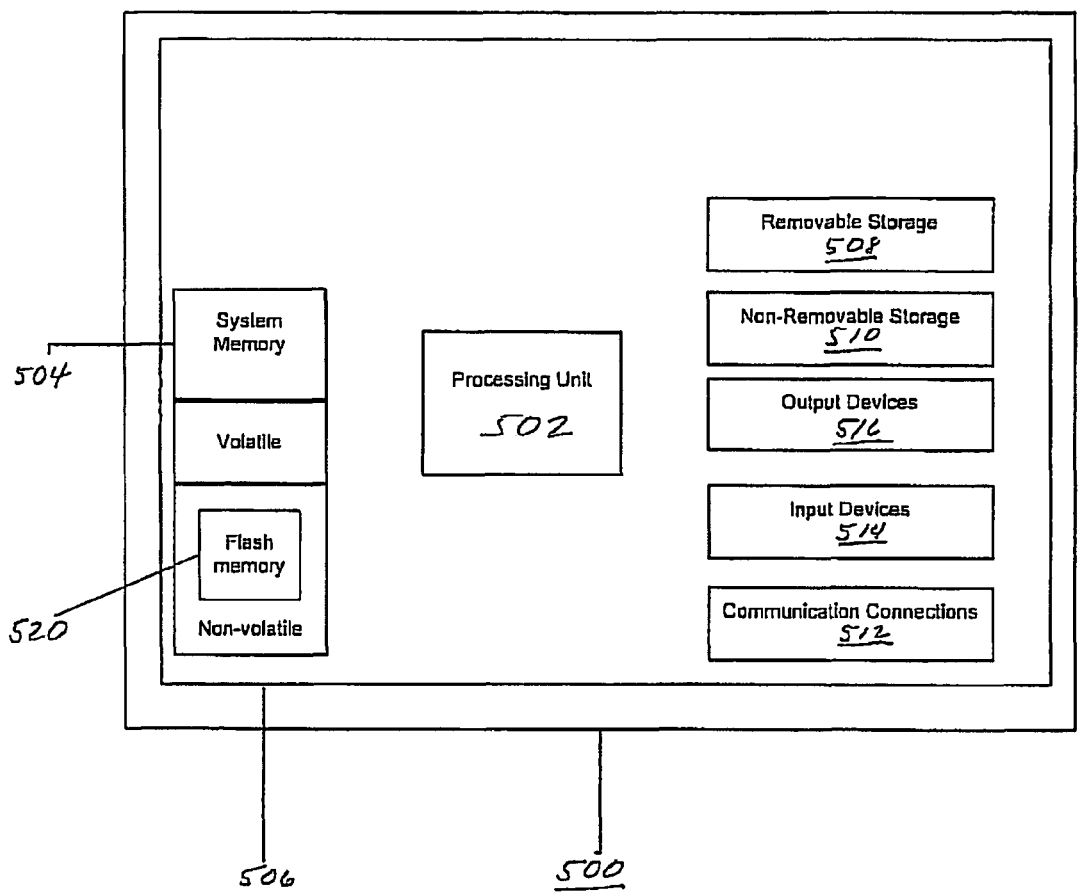
FIG. 15 illustrates a block diagram of a computing device, upon which embodiments of the present claimed subject matter can be implemented.

FIG. 15 illustrates a block diagram of a computing device 500, upon which embodiments of the present claimed subject matter can be implemented. Although computing device 500 is shown and described in FIG. 15 as having certain numbers and types of elements, the embodiments are not necessarily limited to the exemplary implementation. That is, computing device 500 can include elements other than those shown, and can include more than one of the elements that are shown. For example, computing device 500 can include a greater number of processing units than the one (processing unit 502) shown. Similarly, in another example, computing device 500 can include additional components not shown in FIG. 15.

Also, it is important to note that the computing device 500 can be a variety of things. For example, computing device 500 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 500 typically includes at least one processing unit 502 and memory 504. Depending on the exact configuration and type of computing device, memory 504 may be volatile (such as RAM), non-volatile (such as ROM, flash memory, etc.) or some combination of the two. This most basic configuration of computing device 500 is illustrated in FIG. 15 by line 506. Additionally, device 500 may also hive additional features/functionality. For example, device 500 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 15 by removable storage 508 and non-removable storage 510. Computer storage media includes volatile and nonvolatile, removable and non-removable media implemented in any method or technology for storage of information such as computer readable instructions, data structures, program modules or other data. Memory 504, removable storage 508 and non-removable storage 510 are all examples of computer storage media.

Computer storage media includes, but is not limited to, RAM, ROM, EEPROM, flash memory 520 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 500. Any such computer storage media may be part of device 500. Further, in one embodiment, the flash memory 520 utilizes mirrorbit technology to allow storing of two physically distinct bits on opposite sides of a memory cell.

In the one embodiment, the aforementioned non-volatile memory can include a first metal layer provided above a semiconductor substrate, an interlayer insulating film provided above the first metal layer, a second metal layer that is provided in an opening formed in the interlayer insulating film and is in contact with an underlying layer, the second metal layer being connected to the first metal layer, and a first barrier layer that is provided between the second metal layer and the interlayer insulating film and has a different main composition from that of the underlying layer.

Device 500 may also contain communications connection(s) 512 that allow the device to communicate with other devices. Communications connection(s) 512 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 500 may also have input device(s) 514 such as keyboard, mouse, pen, voice input device, game input device (e.g., a joy stick, a game control pad, and/or other types of game input device), touch input device, etc. Output device(s) 516 such as a display (e.g., a computer monitor and/or a projection system), speakers, printer, network peripherals, etc., may also be included. All these devices are well know in the art and need not be discussed at length here.

What is claimed is:

1. A semiconductor device comprising:
   a first metal layer provided above a semiconductor substrate;
   an interlayer insulating film provided above the first metal layer;
   a second metal layer, having side surfaces, that is provided in an opening formed in the interlayer insulating film and is in contact with an underlying layer, wherein the underlying layer contacts the side surfaces of the second metal layer and the second metal layer is connected to the first metal layer; and
   a first barrier layer that is provided between the second metal layer and the interlayer insulating film and has a different main composition from that of the underlying layer wherein the first barrier layer and the underlying layer form a single inclined surface that contacts an inclined side surface of the second metal layer.

2. The semiconductor device as claimed in claim 1, wherein the underlying layer is the first metal layer.

3. The semiconductor device as claimed in claim 1, wherein the underlying layer is a second barrier layer.

4. The semiconductor device as claimed in claim 3, wherein the second metal layer has a different main composition from that of the first metal layer.

5. The semiconductor device as claimed in claim 1, wherein the first barrier layer has a width that decreases upwards.

6. The semiconductor device as claimed in claim 1, wherein the second metal layer comprises at least one of an interconnection layer and a plug metal.

7. A computing device comprising:
   a processor;
   an input component;
   an output component;
   a memory comprising:
   a volatile memory; and
   a non-volatile memory comprising:
      a first metal layer provided above a semiconductor substrate;
      an interlayer insulating film provided above the first metal layer;
      a second metal layer, having side surfaces, that is provided in an opening formed in the interlayer insulating film and is in contact with an underlying layer, wherein the underlying layer contacts the side surfaces of the second metal layer and the second metal layer is connected to the first metal layer;
   a first barrier layer that is provided between the second metal layer and the interlayer insulating film and has a different main composition from that of the underlying layer wherein the first barrier layer and the underlying layer form a single inclined surface that contacts an inclined side surface of the second metal layer.

8. A wireless communications device, said wireless communications device comprising:

a non-volatile memory comprising:
- a first metal layer provided above a semiconductor substrate;
- an interlayer insulating film provided above the first metal layer;
- a second metal layer, having side surfaces, that is provided in an opening formed in the interlayer insulating film and is in contact with an underlying layer, wherein the underlying layer contacts the side surfaces of the second metal layer and the second metal layer is connected to the first metal layer;
- a first barrier layer that is provided between the second metal layer and the interlayer insulating film and has a different main composition from that of the underlying layer wherein the first barrier layer and the underlying layer form a single inclined surface that contacts an inclined side surface of the second metal layer, a processor;
a communications component;
a transmitter;
a receiver; and
an antenna connected to the transmitter circuit and the receiver circuit.

9. A media content player comprising:
a non-volatile memory that stores one or more media content items, said non-volatile memory comprising:
- a first metal layer provided above a semiconductor substrate;
- an interlayer insulating film provided above the first metal layer;
- a second metal layer, having side surfaces, that is provided in an opening formed in the interlayer insulating film and is in contact with an underlying layer, wherein the underlying layer contacts the side surfaces of the second metal layer and the second metal layer is connected to the first metal layer;
- a first barrier layer that is provided between the second metal layer and the interlayer insulating film and has a different main composition from that of the underlying layer wherein the first barrier layer and the underlying layer form a single inclined surface that contacts an inclined side surface of the second metal layer, a user input that enables the selection of one or more of said media item;
a processor coupled to said user input and said storage component that causes the playback of a selected media item, and
one or more playback devices for conveying the playback of said media item.

10. An image acquisition system, comprising:
an image acquisition component for acquiring image data;
a storage component for storing image data, said storage component comprising non-volatile memory comprising:
- a first metal layer provided above a semiconductor substrate;
- an interlayer insulating film provided above the first metal layer;
- a second metal layer, having side surfaces, that is provided in an opening formed in the interlayer insulating film and is in contact with an underlying layer, wherein the underlying layer contacts the side surfaces of the second metal layer and the second metal layer is connected to the first metal layer;
- a first barrier layer that is provided between the second metal layer and the interlayer insulating film and has a different main composition from that of the underlying layer wherein the first barrier layer and the underlying layer form a single inclined surface that contacts an inclined side surface of the second metal layer, and a display unit for displaying said image data stored in said storage component.

* * * * *